United States Patent [19]

Hashimoto

[11] Patent Number: 5,448,597
[45] Date of Patent: Sep. 5, 1995

[54] CLOCK SIGNAL SWITCHING CIRCUIT

[75] Inventor: Yoshinori Hashimoto, Nara, Japan

[73] Assignee: Sharp Kabushiki Kaisha, Osaka, Japan

[21] Appl. No.: 235,134

[22] Filed: Apr. 28, 1994

Related U.S. Application Data

[63] Continuation of Ser. No. 828,118, Jan. 30, 1992, abandoned.

[30] Foreign Application Priority Data

Mar. 18, 1991 [JP] Japan .................. 3-052644

[51] Int. Cl.⁶ ............................. H04L 7/00
[52] U.S. Cl. ....................... 375/354; 327/99; 327/298
[58] Field of Search ................. 375/38, 40, 106; 307/269; 328/63, 72, 104; 340/825.2

[56] References Cited

U.S. PATENT DOCUMENTS

| | | | |
|---|---|---|---|
| 4,855,615 | 8/1989 | Humpleman | 307/269 |
| 4,855,616 | 8/1989 | Way et al. | 307/269 |
| 4,899,351 | 2/1990 | Bonke | 375/108 |
| 4,965,524 | 10/1990 | Patchen | 307/269 |
| 5,086,236 | 2/1992 | Feemster | 307/269 |
| 5,099,140 | 3/1992 | Mudgett | 307/269 |
| 5,099,141 | 3/1992 | Utsunomiya | 328/63 |
| 5,155,380 | 10/1992 | Hwang et al. | 328/63 |

FOREIGN PATENT DOCUMENTS

63-232615 9/1988 Japan .
1116815 5/1989 Japan .

*Primary Examiner*—Stephen Chin
*Assistant Examiner*—T. Ghebretinsae

[57] ABSTRACT

A clock signal switching circuit, to which at least first and second clock signals and a switching signal requesting a switching operation are inputted, and which selectively outputs one of the inputted first and second clock signals by the requested switching operation, the second clock signal being synchronized with the first clock signal and having an integer multiple times cycle of the first clock signal, is provided with: a generating device, to which the second clock signal is inputted, for generating a strobe pulse at a transition timing of the inputted second clock signal; and a sampling device, to which the switching signal and the generated strobe pulse are inputted, for sampling the inputted switching signal at a timing of the inputted generated strobe pulse. The clock signal switching circuit is also provided with: a switching device, to which the first and second clock signals and the sampled switching signal are inputted, for switching to output one of the inputted first and second clock signals in correspondence with the inputted sampled switching signal.

10 Claims, 3 Drawing Sheets

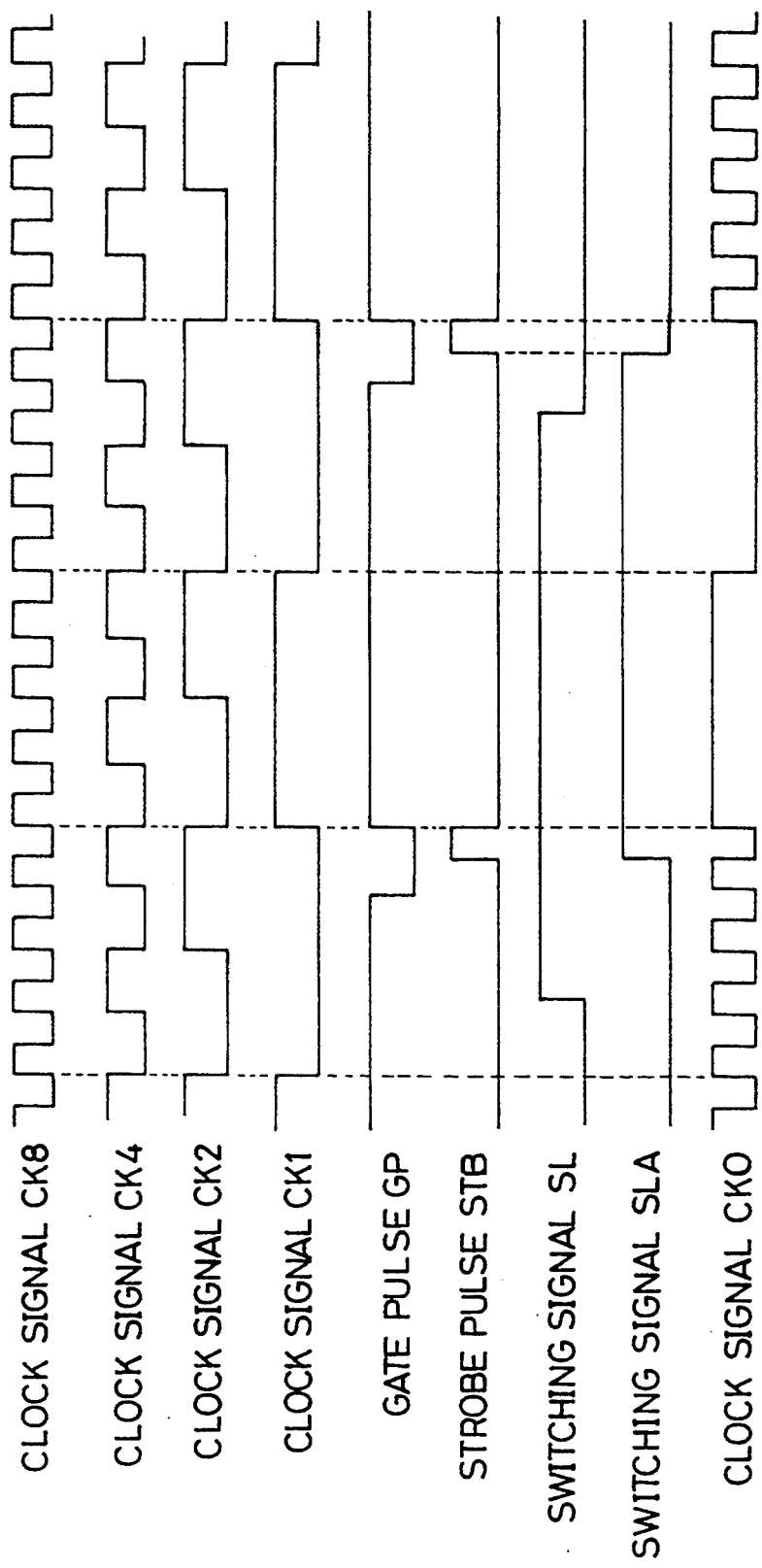

CLOCK SIGNAL SWITCHING CIRCUIT

This application is a continuation of application Ser. No. 07/828,118 filed on Jan. 30, 1992, now abandoned.

BACKGROUND OF THE INVENTION

1. Field of the Invention

The present invention relates to a clock signal switching circuit.

2. Description of the Related Arts

A clock signal switching circuit is utilized in various kinds of semiconductor integrated circuit devices etc., in which the clock signal switching circuit is adapted to switch to selectively pick up one desirable clock signal out of a plurality of different clock signals generated in the semiconductor circuit.

More concretely, this kind of semiconductor integrated circuit device is provided with a clock signal source and a clock dividing circuit as well as such a clock signal switching circuit. The original clock signal is firstly generated by the clock signal source, and then, this original clock signal is divided by two, four, eight and so on, by the clock dividing circuit, so as to generate a plurality of clock signals having different cycles. The generated plurality of clock signals including the original clock signal, are then inputted to the clock signal switching circuit, so a desirable one of the clock signals is selected by the switching operation of the clock signal switching circuit, when a predetermined switching signal requesting the switching operation is given to the clock signal switching circuit.

One example according to such a related art technique is explained here with reference to FIG. 1, which shows a timing chart of the clock signal switching operation.

In FIG. 1, there are shown a clock signal CK8 and a clock signal CK1, which are assumed to be inputted to a clock signal switching circuit in a semiconductor integrated circuit device according to the above-mentioned related art technique. The clock signal CK1 is obtained by use of a dividing circuit by dividing the clock signal CK8 by eight, while the clock signal CK8 is generated by a clock signal source. On the other hand, a switching signal SL to indicate the request for the switching operation by its logical level, is inputted from the external to the clock signal switching circuit.

When the switching from the clock signal CK8 to the clock signal CK1 is to be performed at the time of T1, the logical level of the switching signal SL is turned to be high level of "1" at this time of T1, so that the clock signal switching circuit immediately performs its switching operation to select the clock signal CK1 and output it as an output clock signal CK0, as shown in FIG. 1. Further, when the switching from the clock signal CK1 to the clock signal CK8 is to be performed at the time T2, the logical level of the switching signal SL is turned to be low level of "0" at the time of T2, so that the clock signal switching circuit immediately performs its switching operation to select the clock signal CK8 and output it as the output clock signal CK0.

Accordingly, whenever it is required to change the clock signal CK0 from one to the other i.e. CK1 or CK8, the switching operation can be performed just by changing the logical level of the switching signal SL.

By the way, in a semiconductor integrated circuit device in general, it is desirable that the clock signal is always kept to be in a complete form. That is to say, it is desirable that a proper clock signal in a complete form is outputted from the clock signal switching circuit even at the moment of switching operation while the switching operation is smoothly performed.

However, in case of the above-mentioned related art circuit, when the logical level of the switching signal SL is changed, the clock switching operation is immediately performed according to the new logical level. Here, since the switching signal SL is not necessarily synchronized with the clock signal CK1 or CK8, a noise may be generated in the outputted clock signal CK0 at the time of T1 as shown in FIG. 1. Further, an improper clock signal in an incomplete form, i.e. having a shorter cycle than the real clock signal CK1, may be generated in the outputted clock signal CK0 as a result of shutting off the inputted clock signal CK1 at the time of T2 before the completion of its one cycle, as shown in FIG. 1.

SUMMARY OF THE INVENTION

It is therefore an object of the present invention to provide a clock signal switching circuit, which can perform a smooth switching operation without generating a noise or a clock signal having an improper cycle upon switching.

According to the present invention, the above-mentioned object can be achieved by a clock signal switching circuit, to which at least first and second clock signals and a switching signal requesting a switching operation are inputted, and which selectively outputs one of the inputted first and second clock signals by the requested switching operation. The second clock signal is synchronized with the first clock signal and has an integer multiple times cycle of the first clock signal. The clock signal switching circuit is provided with: generating means, to which the first and second clock signals are inputted, for generating a strobe pulse at a transition timing of the inputted second clock signal, the strobe pulse having a pulse width equal to a half cycle of the second clock signal; and sampling means, to which the switching signal and the generated strobe pulse are inputted, for sampling the inputted switching signal at a transition timing of the inputted generated strobe pulse and memorizing a state of the sampled switching signal to generate a synchronized switching signal synchronized with the first and second clock signals. The clock signal switching circuit is also provided with: switching means, to which the first and second clock signals and the synchronized switching signal are inputted, for switching to output one of the inputted first and second clock signals in correspondence with the inputted synchronized switching signal.

In the clock signal switching circuit of the present invention, the second clock signal is synchronized with the first clock signal and has an integer multiple times cycle of the first clock signal. This kind of second clock signal can be obtained by dividing the first clock signal, for example. In the switching operation, the generating means generates the strobe pulse at the transition timing, i.e. the rising time or the falling time of the inputted second clock signal. Then, the sampling means samples the inputted switching signal at the timing of thus generated strobe pulse. Accordingly, the sampled switching signal is made to be synchronized with both of the first and second clock signals. At this time, since the switching means is adapted to switch in correspondence with the sampled switching signal synchronized with the first and second clock signals, the switching operation can be made also in synchronization with the first and second clock signals.

Consequently, the outputted clock signal from the clock signal switching circuit is free from the incomplete clock signal even at the moment of switching, while the switching operation can be smoothly performed.

Further objects and advantages of the present invention will be apparent from the following description of the preferred embodiment of the invention as illustrated in the accompanying drawings.

BRIEF DESCRIPTION OF THE DRAWINGS

FIG. 3 is a timing chart showing the operation of the clock signal switching circuit of FIG. 2.

DETAILED DESCRIPTION OF THE PREFERRED EMBODIMENTS

A preferred embodiment of the present invention will be described below with reference to the accompanying drawings.

Figure 1:
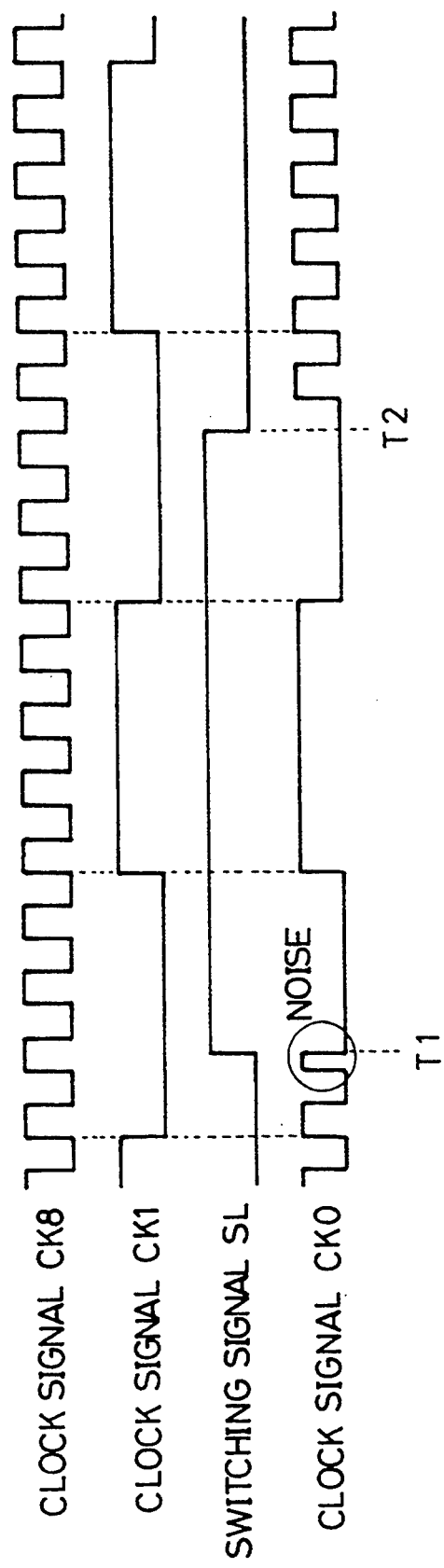
FIG. 1 is a timing chart showing the operation of the clock signal switching circuit according to the related art.
Figure 2:
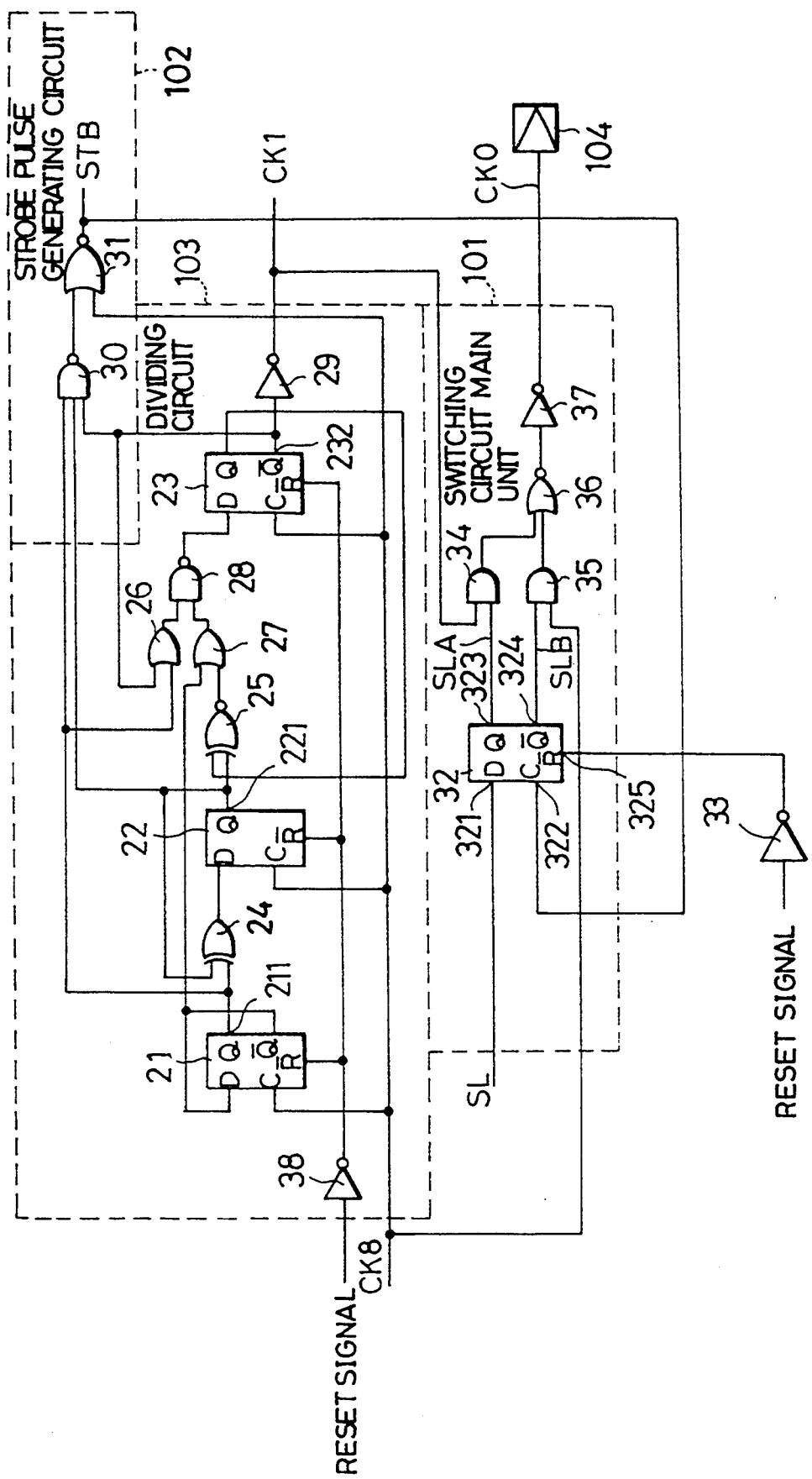
FIG. 2 is a circuit diagram of a clock signal switching circuit and a dividing circuit as one embodiment of the present invention.

In FIG. 2, a clock signal switching circuit is provided with a switching circuit main unit 101 and a strobe pulse generating circuit 102. The reference number 108 designates a dividing circuit. The dividing circuit 103 is provided with D flip-flop circuits 21, 22 and 28, inverter circuits 29 and 38, a two-input NAND circuit 28, two-input OR circuits 26 and 27, a two-input exclusive OR circuit 24, and a two-input exclusive NOR circuit 25.

The dividing circuit 103 is adapted to divide the clock signal CK8 by eight, and output a clock signal CK1 as a result of its dividing operation. The dividing circuit 103 is also adapted to be reset when a reset signal is inputted to the inverter circuit 38 thereof.

On the other hand, the strobe pulse generating circuit 102 is provided with a three-input NAND circuit 30 and a two-input NOR circuit 31. Input terminals of the NAND circuit 30 are connected with a non-inverted output terminal 211 of the D flip-flop circuit 21, a non-inverted output terminal 221 of the D flip-flop circuit 22, and an inverted output terminal 232 of the D flip-flop circuit 23, respectively. One input terminal of the NOR circuit 31 is connected with an output terminal of the NAND circuit 30, and the clock signal CK8 is inputted to the other input terminal of the NOR circuit 31. The strobe pulse generating circuit 102 outputs a strobe pulse STB as an output of the NOR circuit 31.

The switching circuit main unit 101 is provided with a D flip-flop 32 for sampling an inputted switching signal SL by a timing of the strobe pulse STB. The switching signal SL is inputted to a data input terminal 321 of the D flip-flop 32, while a clock input terminal 322 of the D flip-flop 32 is connected with the output terminal of the NOR circuit 31. Here, the logic circuits 34 to 37 are adapted to selectively pick up one of the clock signals, i.e. either the clock signal CK1 or the clock signal CK8. Namely, one of input terminals of the two-input AND circuit 34 is connected with a non-inverted output terminal 323 of the D flip-flop 32, while one of input terminals of the two-input AND circuit 35 is connected with an inverted output terminal 324 of the D flip-flop 32. The clock signal CK1 is inputted to the other input terminal of the two-input AND circuit 34, while the clock signal CK8 is inputted to the other input terminal of the two-input AND circuit The output terminals of the AND circuits 34 and 35, are respectively connected with the input terminal of the two-input NOR circuit 36. The output terminal of the NOR circuit 36 is connected with the input terminal of the inverter circuit 37. The output terminal of the inverter circuit 37 is connected with the clock output terminal 104.

In the switching circuit main unit 101 thus constructed, a clock signal CK0 is outputted from the inverter circuit 37 to the output terminal 104, as described below in detail. The reset signal is inputted to the D reset terminal 325 of the flip-flop 32, via an inverter circuit 33.

Hereinbelow, the operation of the switching circuit main unit 101 and the strobe pulse generating circuit 102 will be explained with reference to FIG. 3, which shows the timing charts of the operation.

In FIG. 3, a clock signal CK4, which is generated by dividing the clock signal CK8 by two, is outputted from the non-inverted output terminal 211 of the D flip-flop circuit 21 in the dividing circuit 103. A clock signal CK2, which is generated by dividing the clock signal CK8 by four, is outputted from the non-inverted terminal 221 of the D flip-flop circuit 22 in the dividing circuit 103.

A clock signal, which has logical level opposite to that of the clock signal CK1, is output from the inverted outputted terminal 232 of the D flip-flop circuit 28. Here, since the NAND circuit 30 takes the AND of these three clock signals, and inverts the result of the AND operation, to output the inverted result, a gate pulse GP is outputted from the NAND circuit 30 as shown in FIG. 3.

Further, the gate operation by use of this gate pulse GP from the NAND circuit 30, is applied to the clock signal CK8 in the NOR circuit 31. As a result, the strobe pulse STB is obtained. As shown in FIG. 3, the strobe pulse STB is generated in synchronization with the rising time of the clock signal CK1, where the pulse width of the strobe pulse STB equal to the half cycle of the clock signal CK8.

The D flip-flop circuit 32 samples the switching signal SL, which is externally inputted by the timing of this strobe pulse STB, and outputs the result as the switching signal SLA and SLB. For example, when the switching signal SL shown in FIG. 3 is inputted to the D flip-flop 32, the flip-flop 32 samples and outputs the switching signal SLA as shown in FIG. 3, which is synchronized with both of the clock signals CK1 and CK8, from the non-inverted output terminal 323, while the D flip-flop 32 outputs the switching signal SLB, which has a logical level opposite to that of the switching signal SLA, from the inverted output terminal 324.

As a result of the above explained operation, on one hand, during the time period when the switching signal SLA is at the logical level of "1", the AND circuit 34 is turned to be in a conductive condition, so that the clock signal CK1 is inputted to the NOR circuit 36 via the AND circuit 34, and is outputted to the output terminal 104 as the clock signal CK0 via the inverter circuit 37.

On the other hand, during the time period when the switching signal SLA is at the logical level of "0", the AND gate 35 is turned to be in a conductive condition, so that the clock signal CK8 is inputted to the NOR circuit 36, and is outputted to the terminal 104 as the clock signal CK0 via the inverter circuit 37. At this time, since the logical levels of the switching signals SLA and SLB are changed in synchronization with the clock signals CK1 and CK8 one, complete cycle of the clock signal CK1 is outputted as the clock signal CK0 to the output terminal 104 without being ceased in the middle of its pulse cycle, and the generation of the noise as in the aforementioned related art technique, is effectively avoided upon switching the clock signal.

As described above in detail, according to the present embodiment, since the strobe pulse generating circuit 102 generates the strobe pulse STB at the rising time of the clock signal CK1, and since the switching circuit main unit 101 samples the sampling signal SL at the timing of the strobe pulse SLB, the sampled switching signals SLA and SLB are made to be synchronized with the clock signal CK1. Accordingly, the switching operation based on the sampled switching signals SLA and SLB, can be performed by the switching circuit main unit 101 in synchronization with the clock signal CK1, so that the resultant selected and outputted clock signal CK0 can be made in a complete form even at the time of switching without noise through a smooth switching operation.

In this embodiment, such a case is explained that the clock signal CK1 of one cycle, is outputted in the clock signal CK0. However, the clock signal CK1 of a plurality of cycles, may be outputted as the clock signal CK0 in case of employing the switching signal SL which has a long duration at the logical level "1".

In the above explained embodiment, the strobe pulse STB is adapted to be generated in synchronization with the rising time of the clock signal CK1. However, the strobe pulse STB may be adapted to be generated in synchronization with the falling time of the clock signal CK1, with the same effect of the present embodiment.

Further, in the above-mentioned embodiment, though the clock signal switching circuit is adapted such that one clock signal is selected from two of the clock signals, i.e. the clock signals CK1 and CK8, the clock signal switching circuit may be adapted such that one clock signal is selected from three or more of the clock signals, since the technique to switch one clock signal to another clock signal can be just employed for this case in the same manner as the present embodiment.

The above-mentioned clock signal switching circuit can be applied to many different technical fields including the general semiconductor integrated circuit devices, since the present embodiment can be constructed by use of basic logic elements.

Many widely different embodiments of the present invention may be constricted without departing from the spirit and scope of the present invention. It should be understood that the present invention is not limited to the specific embodiments described in this specification, except as defined in the appended claims.

What is claimed is:

1. A clock signal switching circuit, to which at least first and second clock signals and a switching signal requesting a switching operation are input, and which selectively outputs one of said inputted first and second clock signals by said requested switching operation, said second clock signal being synchronized with said first clock signal and having an integer multiple times cycle of said first clock signal, comprising:

generating means, to which at least said first and second clock signals are inputted, for generating a strobe pulse, said strobe pulse having a pulse width equal to a half cycle of said first clock signal, and said strobe pulse being synchronized in a transition timing with said both of said first and second clock signals;

sampling means, to which said switching signal and said generated strobe pulse having the pulse width equal to the half cycle of said first clock signal are inputted, for sampling said inputted switching signal at a transition timing of said inputted generated strobe pulse having said pulse width to generate a sampled switching signal and memorizing a state of said sampled switching signal to generate a synchronized switching signal synchronized with said first clock signal; and switching means, to which said first and second clock signals and said synchronized switching signal are inputted, for switching to output one of said inputted first and second clock signals in correspondence with said inputted synchronized switching signal.

2. A clock signal switching circuit according to claim 1, wherein said generating means comprises a NAND circuit, to which a plurality of clock signals generated by dividing said first clock signal are inputted, and a NOR circuit, to which said first clock signal and an output of said NAND circuit are inputted, said NOR circuit outputting said strobe pulse.

3. A clock signal switching circuit according to claim 1, wherein said sampling means comprises a flip-flop circuit.

4. A clock signal switching circuit according to claim 1, wherein said switching means comprises: a first AND circuit, to which said first clock signal and said sampled switching signal are inputted; a second AND circuit, to which said second clock signal and said sampled switching signal are inputted; a NOR circuit, to which outputs of said first and second AND circuits are inputted; and an inverter circuit, to which an output of said NOR circuit is inputted, said inverter circuit outputting one of said first and second clock signals.

5. A clock signal switching circuit according to claim 1, wherein said sampling means is adapted to be reset by a reset signal, which is given externally from said clock signal switching circuit.

6. A clock signal switching circuit according to claim 1, wherein said first clock signal is generated by a clock signal source.

7. A clock signal switching circuit according to claim 1, wherein said second clock signal is generated by dividing said first clock signal.

8. A clock signal switching circuit according to claim 1, wherein said clock signal switching circuit is equipped in a semiconductor integrated circuit device including a clock dividing circuit for dividing said first clock signal to generate said second clock signal.

9. A clock signal switching circuit according to claim 1, wherein said switching signal comprises a logical level signal.

10. The clock signal switching circuit according to claim 1, wherein said second clock signal has a cycle at least eight multiple times of a cycle of said first clock signal.

* * * * *